United States Patent [19]

Mitchell et al.

[11] Patent Number: 4,829,019
[45] Date of Patent: May 9, 1989

[54] METHOD FOR INCREASING SOURCE/DRAIN TO CHANNEL STOP BREAKDOWN AND DECREASE P+/N+ ENCROACHMENT

[75] Inventors: Allan T. Mitchell, Garland; Howard L. Tigelaar, Allen; Bert R. Riemenschneider, Plano, all of Tex.

[73] Assignee: Texas Instruments Incorporated, Dallas, Tex.

[21] Appl. No.: 48,719

[22] Filed: May 12, 1987

[51] Int. Cl.⁴ ............................................ H01L 21/473
[52] U.S. Cl. ...................................... 437/069; 437/70
[58] Field of Search .................... 437/63, 69, 70, 27, 437/28, 30

[56] References Cited

U.S. PATENT DOCUMENTS

H204  2/1987  Oh et al. .............................. 156/648
4,442,591  4/1984  Haken .................................... 437/63

FOREIGN PATENT DOCUMENTS 0137650  10/1981  Japan ...................................... 437/70
0023219   2/1982  Japan ...................................... 437/27
0165434   9/1984  Japan ...................................... 437/70
0224141  12/1984  Japan ...................................... 437/70
0100944   5/1986  Japan ...................................... 437/69

Primary Examiner—Olik Chaudhuri
Attorney, Agent, or Firm—Larry C. Schroeder; James T. Comfort; Melvin Sharp

[57] ABSTRACT

A method of forming semiconductor devices wherein a gap is formed beneath the field oxide between the channel stop implant and source/drain regions in the moat or active element region to prevent or minimize encroachment of channel stop impurity toward the source/drain regions to form spurious pn junctions and/or reduce the active element region.

4 Claims, 5 Drawing Sheets

METHOD FOR INCREASING SOURCE/DRAIN TO CHANNEL STOP BREAKDOWN AND DECREASE P+/N+ ENCROACHMENT

FIELD OF THE INVENTION

This invention relates to a method for minimizing breakdown in semiconductor devices between the P+ or N+ channel stop beneath the field oxide and the N+ or P+ source/drain thereof.

BACKGROUND OF THE INVENTION

A problem that arises in the manufacture of certain prior art FETs having a source/drain in the moat region and a channel stop under the field oxide is that the P+ or N+ channel stop impurity has a tendency to migrate under the field oxide toward and overlap the N+ or P+ source/drain of the transistor during processing, whereby the channel stop actually forms an undesirable P+N+ junction with the source/drain. Such migration also encroaches upon the channel region of MOSFET transistors, thereby undesirably decreasing the effective width of the transistor, as is well known. It is desired to eliminate or at least minimize these problems of the prior art by isolating the channel stop implant from the source/drain of the transistor being formed.

SUMMARY OF THE INVENTION

In accordance with the present invention, several procedures are provided whereby the above noted problem is minimized. Briefly, in accordance with a first embodiment of the invention, a nitride layer is patterned to cover the moat or active element region and exposes the proposed field oxide region. A side wall oxide is formed on the nitride layer and the channel stop is implanted into the exposed region. The side wall oxide is then removed to provide a gap from the end of the channel stop to the side of the nitride layer. The field oxide is then grown, the nitride layer is removed and the standard processing steps for formation of an FET are performed. The resulting FET will have a gap between the source/drain regions formed and the channel stop due to the gap which was formed due to the presence of the sidewall oxide during channel stop formation. In accordance with a second embodiment of the invention, a nitride layer is deposited and a patterned photoresist is deposited thereover. After removal of the nitride from the exposed areas, leaving the nitride over the proposed moat region with photoresist thereover, the channel stop impurity is implanted into the exposed substrate. The photoresist is then etched slightly with an isotropic etch to expose a small portion of the nitride layer. The newly exposed nitride layer portion is etched with an etch selective to nitride to leave a gap from the end of the field oxide implant to the side wall of the nitride layer. The field oxide is than grown and further processing steps take place as in the first embodiment described hereinabove. The end result is the same as described in connection with the first embodiment. In accordance with a third embodiment of the invention, a polycrystalline silicon layer is deposited on the silicon substrate followed by a silicon nitride layer and a patterned photoresist layer. The nitride and polycrystalline silicon layer are then etched in accordance with the photoresist pattern to retain nitride, polycrystalline silicon and photoresist over the moat area wherein the active devices will be formed. The photo resist is removed and a sidewall oxide is formed on the side walls of the nitride polysilicon layer. A channel stop impurity is implanted into the substrate to provide a region of heavy channel stop spaced from the nitride covered region. The sidewall oxide is then removed and the exposed silicon is oxidized to form a field oxide with reduced bird's beaking according to the teachings of the prior art (polysilicon buffered LOCOS technique) and the components are formed in the moat region in standard manner. The advantage of using a polysilicon buffered LOCOS approach herein is that it permits use of a thicker nitride layer (2400 angstroms vs. 1400 angstroms) that provides a more effective channel stop implant mask over the active region. It can be seen from each of the embodiments herein that a gap region is formed essentially at the location of the bird's beak, between the channel stop implanted region and the active devices formed in the moat region. This prevents the formation of the n+p+ diode which has a low breakdown voltage in the prior art devices. The gap also minimizes channel stop impurity encroachment which encroachment reduces transistor width and transistor drive current in prior art devices.

DESCRIPTION OF THE PREFERRED EMBODIMENTS

Figure 1:
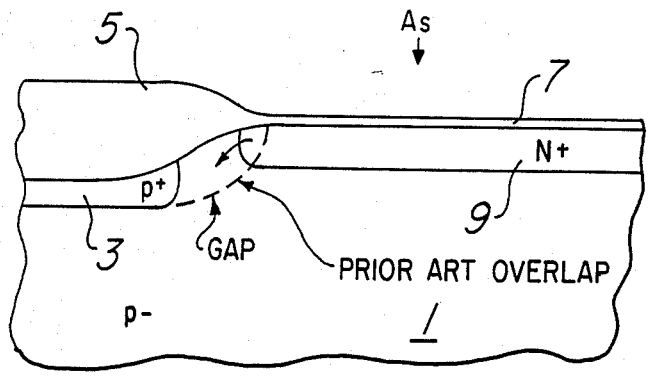
FIGS. 1 is a schematic illustration to demonstrate the problem encountered by using prior art techniques and the solution thereof.

Referring first to FIG. 1, there is shown a schematic diagram to demonstrate the problem encountered in prior art devices. As can be seen in FIG. 1, in the manufacture of FET semiconductor devices, assuming a p− silicon substrate 1 is being utilized, a p+ region 3 is formed as a channel stop which rests beneath the field oxide 5 having a bird's beak region and a thin pad oxide 7 over the moat region where devices will be fabricated. An n+ region 9, which is the source/drain diffusion for one of the source or drain, is formed under the pad oxide 7. It can be seen that, in the prior art impurity migration the p+ and n+ regions overlap and form a p+n+ junction. In addition, in the prior art, the channel stop impurity encroaches into the active region of MOSFET type transistors, thereby limiting transistor current drive. It is the intention of this invention to provide a gap between the channel stop implant and the source/drain region to prevent or impede impurity migration from channel stop to source/drain region and to impede impurity migration from the channel stop into the active region of the transistor.

Figure 2A:
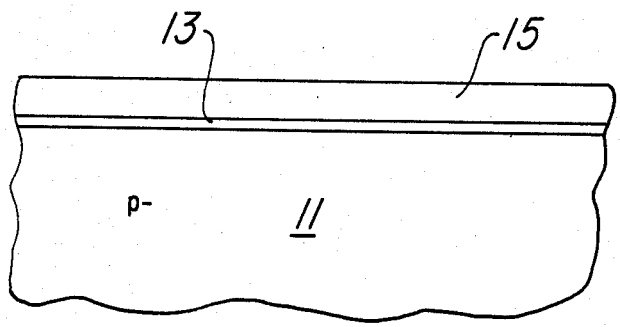
FIGS. 2a to 2f demonstrate a series of process steps in accordance with a first embodiment of the invention to fabricate semiconductor devices without the defects noted as to FIG. 1.
Figure 2B:
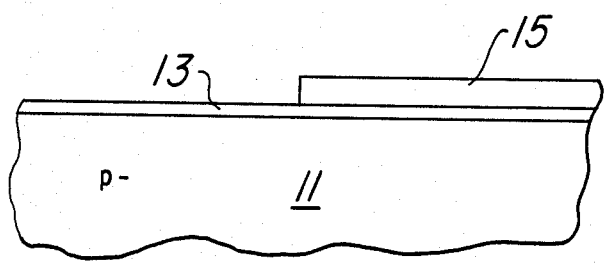
Figure 2C:
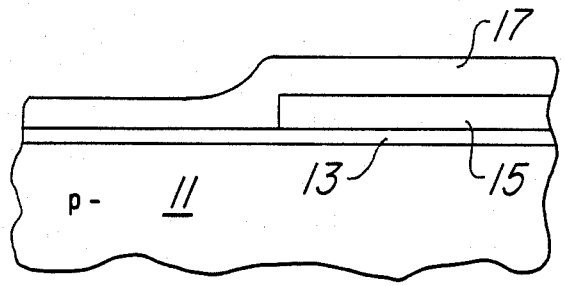
Figure 2D:
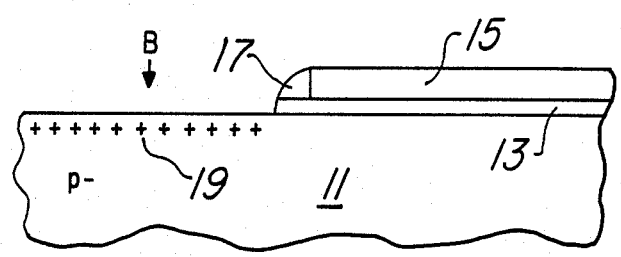
Figure 2E:
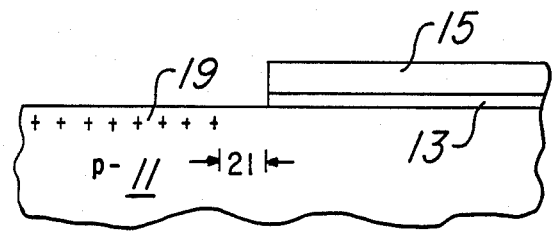
Figure 2F:
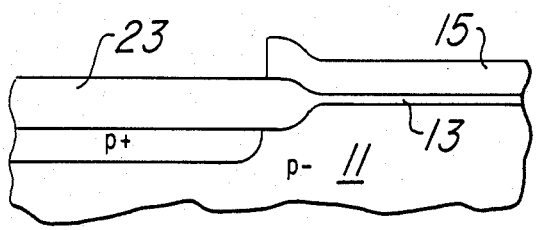

Referring now to FIGS. 2a to 2f, there is shown a series of processing steps in accordance with a first embodiment of the invention to provide the desired isolation between the channel stop implant and source/- drain. As can be seen in FIG. 2a, there is provided a p− silicon substrate 11 having a grown oxide 13 thereon of about 350 Angstroms and a chemically vapor deposited (CVD) silicon nitride layer 15 thereover of about 1400 Angstroms. (It should be understood and is well known to those skilled in the art that, while all embodiments are described with respect to p− substrates, n− substrates can also be used with appropriate changes in impurities utilized to produce complementary devices.) A patterned photoresist (not shown) is then formed over the nitride layer and the nitride layer is etched away in the region where the field oxide will be formed and is retained in the moat regions where the active devices will be formed as shown in FIG. 2b. An insulating layer 17 is then conformally formed over the substrate and nitride, such as by deposition of a plasma oxide or deposition of tetraethylorthosilicate (TEOS) as shown in FIG. 2c. The layer 17 is then etched using an anisotropic etch whereby the layer 17 is totally removed except at the sidewalls of the nitride layer 15 as shown in FIG. 2d. For an example of a suitable anisotropic etch see Fu et al., U.S. Pat. No. 4,356,040. Also the exposed portion of the pad oxide 13 is removed. An appropriate impurity 19 to create a p+ channel top region is then implanted into the substrate 11 in the unmasked regions. Boron is implanted at an energy of approximately 100 KeV and a density of approximately $1 \times 10^{12}$ atoms/cm$^2$ in the present embodiment. The sidewall oxide 17 of FIG. 2d is then removed using an etch selective thereto as shown in FIG. 2e. A 10 solution is an appropriate etch for this purpose. It can be seen that a gap 21 appears from the rightmost portion of the channel stop implant 19 and the side wall of the nitride layer 15. The field oxide 23 is then thermally grown in a steam ambient at a approximately temperature of 900° C. for approximately 9.5 hours, forming a bird's beak structure as is well known as shown in FIG. 2f. The remaining nitride layer 15 is then removed and the devices in the moat region including source/drain are formed as shown in FIG. 1. As can be seen, there is a gap between the channel stop implant and the source/drain with an intermediate p− region in the gap. This inhibits impurity migration and also provides an adequate separation between p+ and n+ regions to minimize formation of unwanted pn junctions.

Figure 3A:
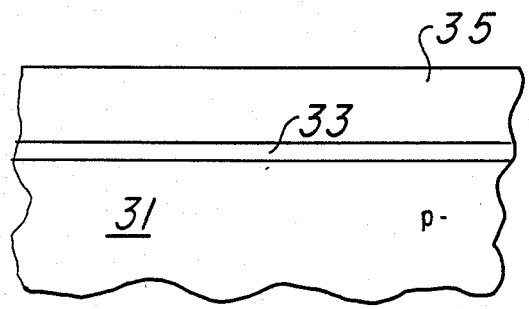
FIGS. 3a to 3d demonstrate a series of process steps in accordance with a second embodiment of the invention to fabricate semiconductor devices without the defects noted as to FIG. 1.
Figure 3B:
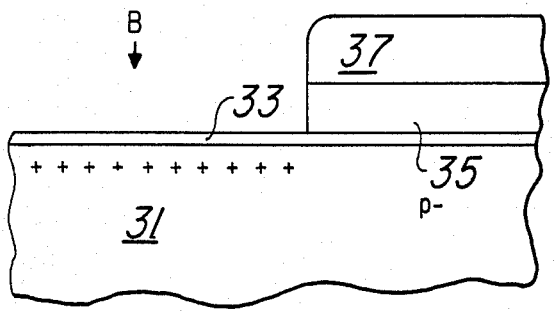
Figure 3C:
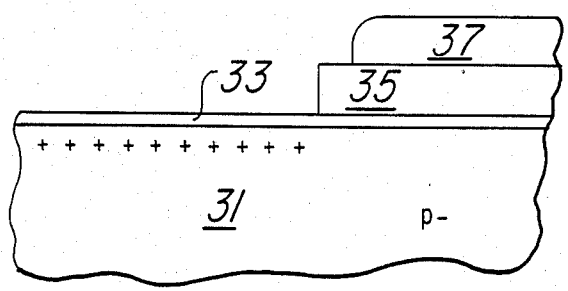
Figure 3D:
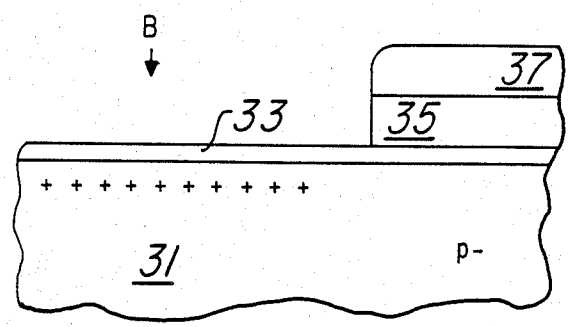

Referring now to FIGS. 3a to 3d, there is shown a second embodiment in accordance with the present invention. With reference first to FIG. 3a there is shown the same starting arrangement as in FIG. 2a with a p− silicon substrate 31, a pad oxide 33 thereover and a silicon nitride layer 35 thereover. A patterned photoresist layer 37 is then formed over the nitride layer 35 and the nitride layer is etched where exposed, leaving the pad oxide 33 in the exposed region as shown in FIG. 3b. A boron channel stop is then implanted into the substrate 31 in the unmasked regions as shown in FIG. 3b and the photoresist 37 is then isotropically etched to expose a small region 39 of the nitride layer 35 thereunder as shown in FIG. 3c. The exposed nitride region 39 is then removed by use of an etch selective to photoresist as shown in FIG. 3d and a field oxide is then grown on the exposed substrate as in FIG. 2f. Processing continues as in the embodiment of FIG. 2a and 2f. As can be seen, the final device as produced by the method of FIGS. 3a and 3d is essentially the same as that produced by the method of FIGS. 2a to 2f.

Figure 4A:
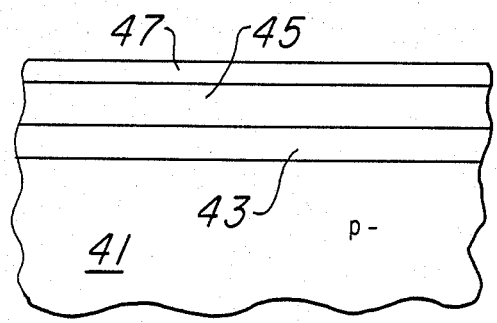
FIGS. 4a to 4d demonstrate a series of process steps in accordance with a third embodiment of the invention to fabricate semiconductor devices without the defects noted as to FIG. 1.
Figure 4B:
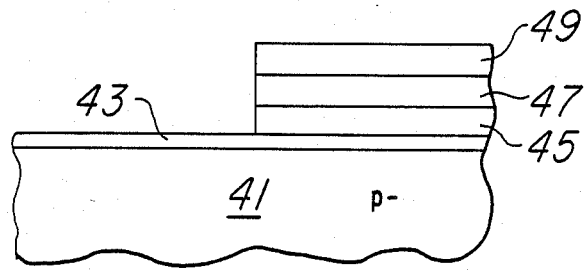
Figure 4C:
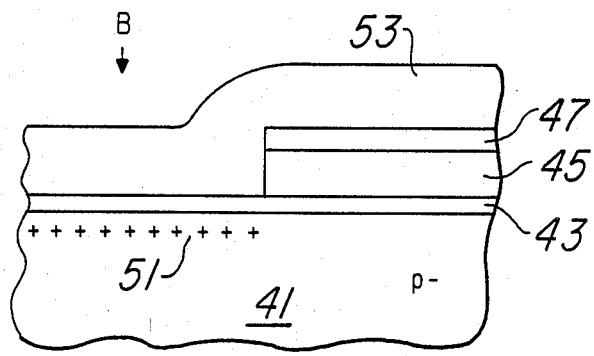
Figure 4D:
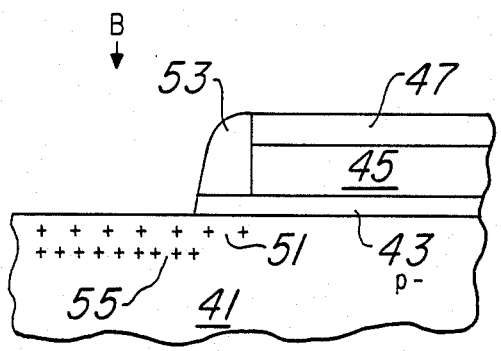

Referring now to FIGS. 4a to 4d, there is shown a third embodiment in accordance with the present invention. With reference first to FIG. 4a, there is shown the starting arrangement wherein a p− substrate 41 with a pad oxide 43 thereon has a layer of polysilicon 45 deposited over the oxide 43 with a silicon nitride layer 47 formed over the polysilicon layer 45, all in standard manner. A patterned photoresist layer 49 is formed on the nitride layer 47 and both the nitride layer and polycrystalline silicon are etched to form exposed regions of oxide 43 where the field oxide is to be formed, with the nitride remaining over the moat region as shown in FIG. 4b. The photoresist is then removed and an insulating layer 53 is then conformally deposited over the substrate as in FIG. 4c, the layer preferably being TEOS or a plasma oxide. The insulating layer 53 is than anisotropically etched to leave the sidewall oxide 53 on the sidewalls of the nitride layer 47 as shown in FIG. 4d. During this anisotropic etch, the oxide layer 43 is removed in the exposed regions. A heavy dose of channel stop impurity 55, preferably boron, is then implanted into the exposed regions of the substrate 41 to produce a heavily doped channel stop area 55 therebeyond as shown in FIG. 4d. The sidewall oxide 53 is then removed, using a selective etch as in FIG. 2e and processing continues as in the embodiment of FIGS. 2a to 2f. The result is a gap between the channel stop region and the source/drain.

It can be seen that there have been provided several methods whereby the channel stop implants of semiconductor devices are isolated from the source/drain regions thereof to prevent formation of undesirable and spurious pn junction as well as reducing encroachment into the channel region of MOSFET transistors.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating semiconductor devices, comprising the steps of:
   (a) providing a semiconductor substrate having a first patterned mask thereon;
   (b) implanting a channel stop impurity into said substrate in the unmasked regions thereof;
   (b.1) providing a second patterned mask over a portion of said first patterned mask;
   (c) removing a portion of said first patterned mask not masked by said second patterned mask;
   (d) forming a field oxide over the unmasked regions of said substrate, and
   (e) forming active semiconductor regions in the regions masked by said first patterned mask.

2. The method of claim 1 wherein said first mask is formed of silicon nitride and said second mask is formed of photoresist.

3. The method of claim 1 wherein step (e) comprises forming a source/drain region in said substrate in the region thereof beneath said first mask of conductivity type opposite to said impurity.

4. The method of claim 2 wherein step (e) comprises forming a source/drain region in said substrate in the region thereof beneath said first mask of conductivity type opposite to said impurity.

* * * * *